(12) United States Patent
Kozlowski

(10) Patent No.: US 8,063,964 B2
(45) Date of Patent: Nov. 22, 2011

(54) DUAL SENSITIVITY IMAGE SENSOR

(75) Inventor: Lester J. Kozlowski, Simi Valley, CA (US)

(73) Assignee: AltaSens, Inc., Thousand Oaks, CA (US)

(*) Notice: Subject to any disclaimer, the term of this patent is extended or adjusted under 35 U.S.C. 154(b) by 763 days.

(21) Appl. No.: 11/986,238

(22) Filed: Nov. 20, 2007

(65) Prior Publication Data
US 2009/0128677 A1 May 21, 2009

(51) Int. Cl.
H04N 3/14 (2006.01)
H04N 5/335 (2011.01)

(52) U.S. Cl. ..... 348/308; 348/302; 348/312; 250/208.1; 377/60

(58) Field of Classification Search .................. 348/308, 348/302, 312; 250/208.1; 377/60
See application file for complete search history.

(56) References Cited

U.S. PATENT DOCUMENTS

| 4,484,210 | A | 11/1984 | Shiraki et al. | |
| 5,892,510 | A | 4/1999 | Lau et al. | |
| 5,892,540 | A | 4/1999 | Kozlowski et al. | |
| 6,532,040 | B1 | 3/2003 | Kozlowski et al. | |
| 6,670,990 | B1 | 12/2003 | Kochi et al. | |
| 6,710,804 | B1* | 3/2004 | Guidash | 348/302 |
| 6,747,264 | B2 | 6/2004 | Miida | |
| 6,831,692 | B1* | 12/2004 | Oda | 348/315 |
| 7,046,294 | B1 | 5/2006 | Sasaki | |
| 7,327,393 | B2* | 2/2008 | Ying et al. | 348/308 |
| 7,430,011 | B2* | 9/2008 | Xu et al. | 348/362 |
| 7,489,352 | B2* | 2/2009 | Nakamura | 348/296 |
| 7,605,398 | B2* | 10/2009 | Chen et al. | 257/48 |
| 7,605,855 | B2* | 10/2009 | Wang et al. | 348/308 |
| 7,732,743 | B1* | 6/2010 | Buchin | 250/208.1 |
| 2001/0010554 | A1* | 8/2001 | Yoshida | 348/312 |
| 2006/0050163 | A1* | 3/2006 | Wang et al. | 348/308 |
| 2007/0046800 | A1* | 3/2007 | Chen et al. | 348/308 |

OTHER PUBLICATIONS

International Search Report.
"A Technique for Suppressing Dark Current Generated by Interface States in Buried Channel CCD Imagers" N.S. Saks, Jul. 1980 IEEE Electron Device Letters, vol. EDL-1, No. 7, pp. 131-133.
"Self-Scanned Silicon Image Detector Arrays" Peter J. W. Noble, Apr. 1968, IEEE Transactions on Electron Devices, pp. 202-209.

* cited by examiner

Primary Examiner — David Ometz
Assistant Examiner — Antoinette Spinks
(74) Attorney, Agent, or Firm — Reed Smith LLP

(57) ABSTRACT

A dual sensitivity image sensor provides a standard mode and a high-sensitivity mode of operation via iSoC integration. In addition to boosting sensitivity, the high sensitivity mode also reduces temporal noise thereby optimally boosting the Signal-to-Noise Ratio (SNR) of the image sensor. The circuit does not significantly increase pixel complexity and requires minimal changes to the support circuits in the iSoC including the addition of support and control circuitry to facilitate seamless mode change.

11 Claims, 8 Drawing Sheets

DUAL SENSITIVITY IMAGE SENSOR

BACKGROUND OF THE INVENTION

1. Field of the Invention

The present invention relates generally to CMOS image sensors, and more particularly to pixel circuits for imaging System-on-Chip (iSoC) sensors capable of imaging under a variety of lighting conditions including low light.

2. Description of the Related Art

Visible imaging systems implemented using CMOS image sensors significantly reduce camera cost and power while improving resolution and reducing noise. The latest cameras use CMOS iSoC sensors that efficiently marry low-noise image detection and processing with a host of supporting blocks including timing controller, clock drivers, reference voltages, A/D conversion and key signal processing elements. High-performance video cameras are now produced using a single CMOS integrated circuit supported by only a lens and battery. These improvements translate into smaller camera size and longer battery life. The improvements also translate to dual-use cameras that simultaneously or successively produce high-resolution still images and high definition video.

The advantages offered by system-on-chip integration in CMOS visible imagers for emerging camera products have spurred considerable effort to further improve active-pixel sensor (APS) devices. Active-pixel sensors with on-chip analog and/or digital signal processing provide temporal noise superior to scientific-grade video systems using CCD sensors.

Most currently available image sensors use an architecture wherein the pixel establishes the sensor's intrinsic sensitivity and base ISO speed per Industry Organization for Standardization specification ISO 12332-2006, which is used for determining the standard exposure index for electronic image sensors. In order to boost sensitivity or ISO speed, amplifiers downstream of the pixel normally amplify the nominal pixel sensitivity. This approach typically degrades dynamic range for video applications or exposure latitude for still capture use. Post-pixel amplification also raises the requisite gain-bandwidth requirement for the signal processing chain and thereby often increases sensor noise. Consequently, while the sensitivity-based ISO speed is set higher, the noise-based ISO speed often actually degrades. In-camera signal processing is hence used to reduce the noise in trade for actual resolution.

FIG. 1 illustrates a four transistor (4T) pixel circuit of the prior art that is supported with correlated double sampling in the iSoC for low-noise imaging in rolling shutter designs. In operation, the reset transistor M1 is reset to clear the charge from the pixel. In this circuit, the pixel signal is stored as a charge on a floating diffusion (shown as $C_{FD}$). The readout transistor M3 reads out a first signal from the pixel. This first signal is not photo-generated signal from the photodiode, but is instead reset noise associated with circuit operation. Then the transfer transistor M4 transfers a charge from the photodiode PD1 to the floating diffusion $C_{FD}$, which in turn is amplified by the amplifier transistor M2, configured as a source-follower. The signal is then read out by the readout transistor M3. The two signals are differenced to efficiently remove the reset noise component. This process is repeated on a row-by-row basis for each row in an image sensor array.

This basic circuit requires four transistors for each pixel cell and the floating diffusion sets the nominal sensitivity for the pixel and image sensor. Prior to any amplification in the column buffer, the detector voltage, $V_{det}$, generated by reading out the photodetector immediately after a specific integration time, $t_{int}$, is:

$$V_{det} = \frac{Q}{C_{FD}} = \frac{i_{det} t_{int}}{C_{FD}}$$

Typically, any required boost in sensitivity is normally accommodated by post-pixel amplification. For example, FIG. 2 is a column buffer circuit taught in U.S. Pat. No. 5,892,540 and fully incorporated herein by reference; it provides: 1) a multitude of selectable gain settings to boost or decrease sensitivity along with: 2) a means for supporting the correlated double sampling required for subtracting reset noise; and 3) column buffer dc offset nonuniformity cancellation. Unfortunately, particularly under condition of the higher gain settings and for high frame rate applications such as high definition television, the requisite gain-bandwidth product of the amplifier stages can be especially challenging to support and thereby generate nonlinearity, excess noise, or other artifacts. Furthermore, generation of excess white noise is likely since gain is applied after signal is transferred to the column buffer.

SUMMARY OF THE INVENTION

The present invention is a programmable pixel circuit for iSoC image sensors that supports two modes of operation to alternately deliver nominal or enhanced sensitivity. Dual-mode operation is achieved by supporting multi-mode pixel operation via system-on-chip functionality in peripheral circuits supporting pixel readout from the embedded imaging matrix array. There is consequently no significant increase in pixel complexity or degradation in optical fill factor. The low-noise, high-sensitivity mode is achieved by effectively replacing the pixel sense capacitance with the smaller capacitance of a switched capacitor integrator that is built using the same transistors as the source follower amplifier of the standard configuration.

In one embodiment the present invention is an image sensor circuit comprising at least one pixel circuit comprising: a photodetector; a transfer transistor connected to the photodetector and a first supply bus; a reset transistor connected to the transfer transistor and a second supply bus; an amplifier transistor connected to the transfer transistor, the reset transistor, and a third supply bus; a signal readout transistor connected to the amplifier transistor and a signal bus; and a dual sensitivity selection and support circuit comprising: a high sensitivity enable transistor connected to the signal bus; a standard sensitivity enable transistor connected to the signal bus; a correlated double sampling switch transistor connected to the signal bus; a correlated double sampling capacitor connected in series with the signal bus, between the standard sensitivity enable transistor and the correlated double sampling switch transistor; a high sensitivity switch transistor connected to the third supply bus; and a standard sensitivity switch transistor connected the to the third supply bus.

A column buffer circuit is additionally connected to the signal bus and the dual sensitivity selection and support circuit and the column buffer are shared by a column of pixels in an image sensor. In a preferred embodiment, the amplifier transistor and the readout transistor are formed as a single dual-gate transistor to reduce the Miller capacitance associated with the circuit.

An image sensor array formed according to the present invention may comprise a plurality of columns of pixels, the image sensor comprising: a column buffer connected to each column of pixels; a dual sensitivity selection and support circuit connected between the column bus and the pixels comprising: a high sensitivity enable transistor connected to a signal bus, the signal bus connected to each pixel in a column; a standard sensitivity enable transistor connected to the signal bus; a correlated double sampling switch transistor connected to the signal bus; a correlated double sampling capacitor connected in series with the signal bus, between the standard sensitivity enable transistor and the correlated double sampling switch transistor; a high sensitivity switch transistor connected to a supply bus, the supply bus connected to an amplifier transistor in each pixel; and a standard sensitivity switch transistor connected the to the supply bus.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

According to the present invention, an imaging System-on-Chip (iSoC) circuit supporting dual-mode sensitivity is provided that comprises few transistors and bias supplies per pixel and maintains high optical fill factor, low noise and compatibility with conventional CMOS image sensor (CIS) process technology. The two sensitivity modes include: 1) a standard mode featuring nominal sensitivity and noise for most lighting conditions and; 2) an enhanced sensitivity mode for operation at low light levels with lower temporal noise. In addition, the enhanced sensitivity mode is capable of operating with lower noise so that the both the sensitivity-based ISO speed and the noise-based ISO speed are improved.

Figure 1:
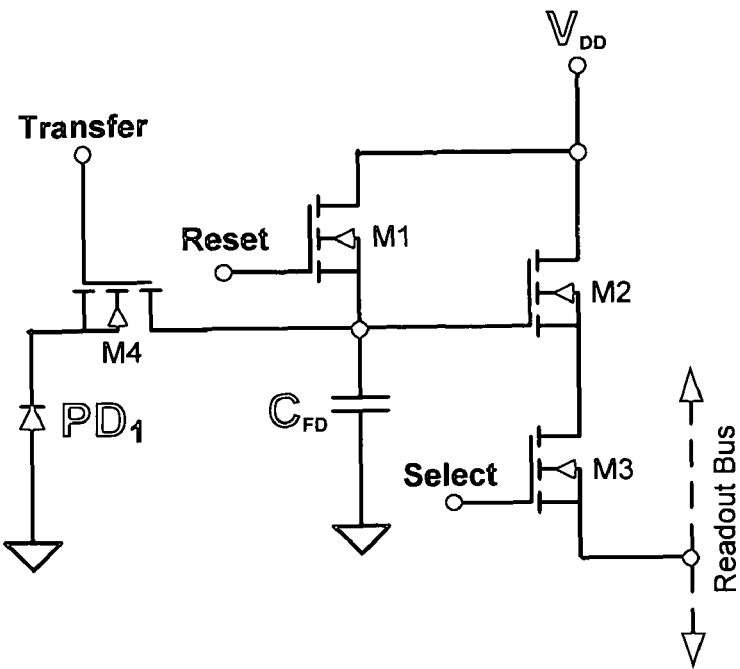
FIG. 1 is a schematic of a prior art 4T pixel circuit having rolling shutter with correlated double sampling.
Figure 3:
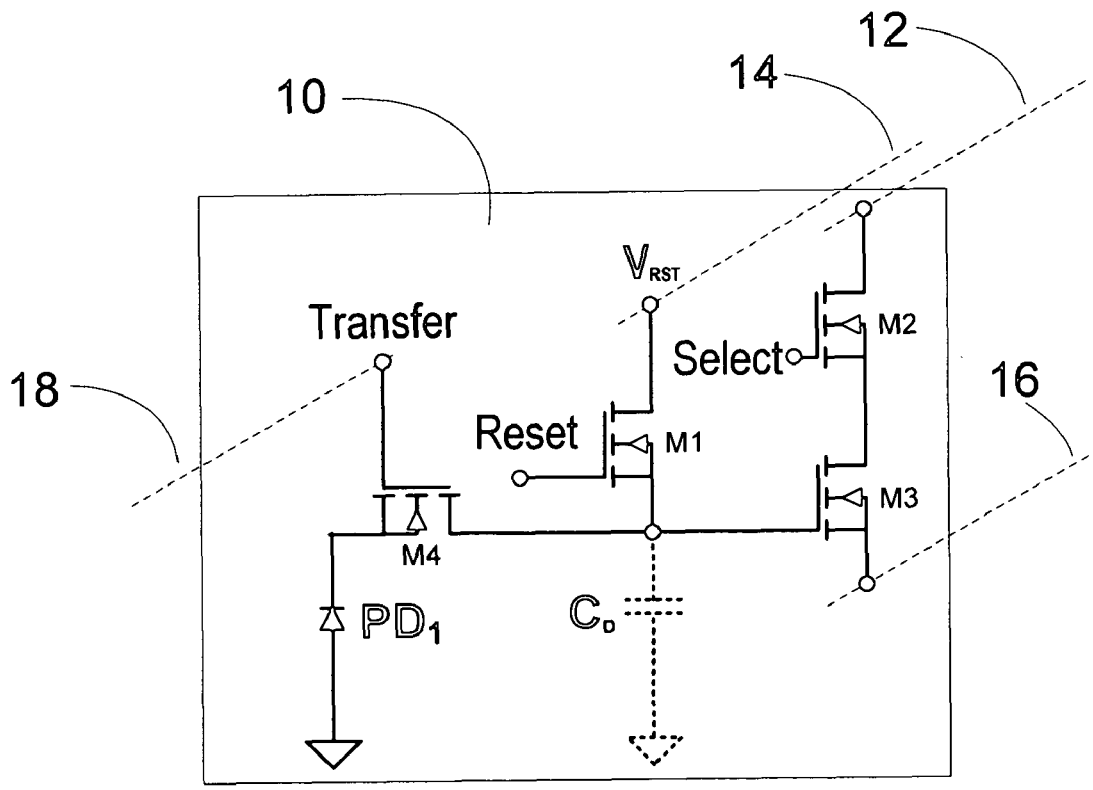
FIG. 3 is a schematic of an embodiment for the 4T pixel circuit of the present invention.
Figure 2:
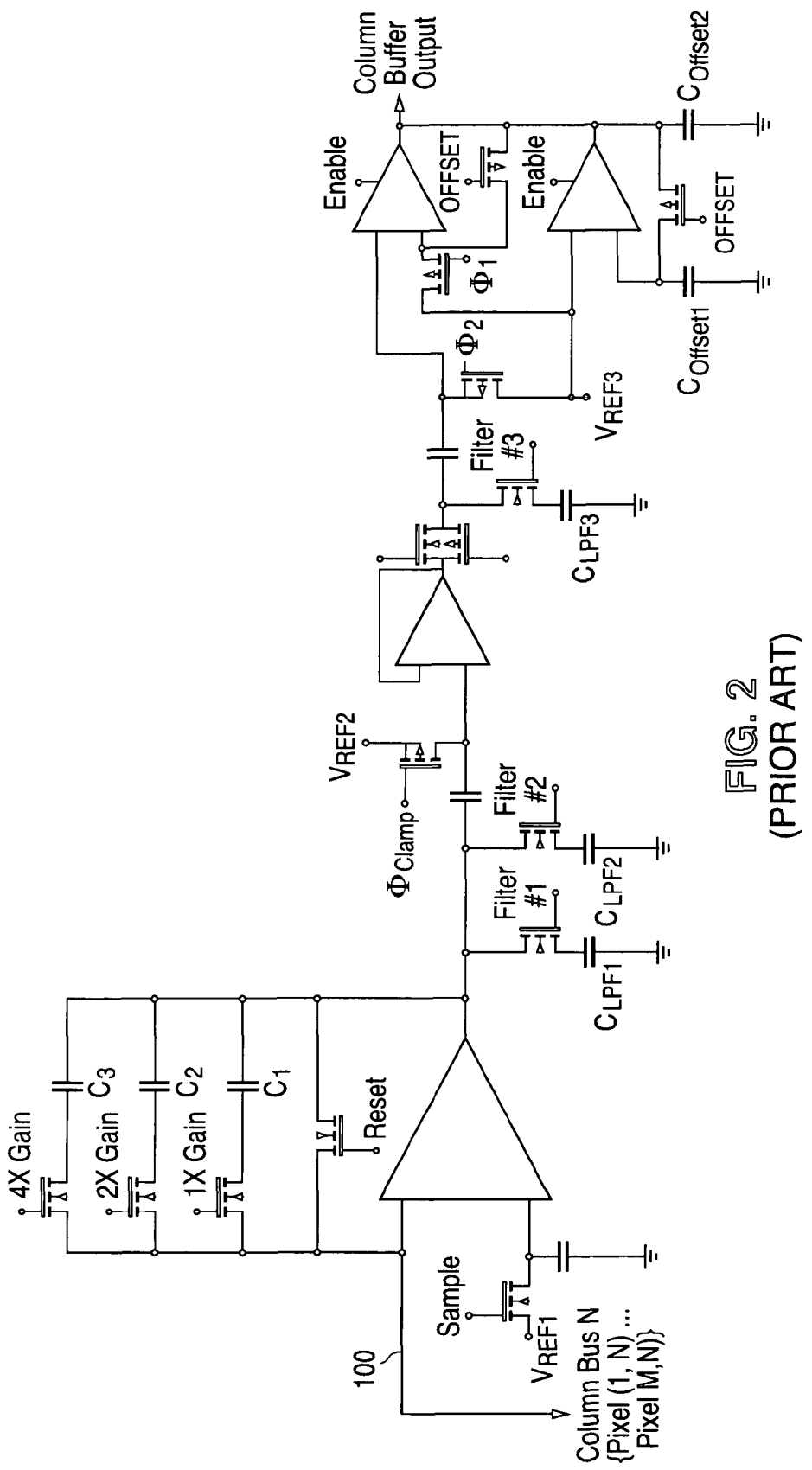
FIG. 2 is a schematic of a prior art column buffer supporting the 4T pixel circuit with programmable gain (U.S. Pat. No. 5,892,540)

In the normal sensitivity mode of the preferred embodiment, the pixel circuit is a four transistor pixel 10 supported by a bus architecture comprising three supply buses 14, 16, 18 and a single signal bus 12 as shown in FIG. 3. The pixel is operated in standard sensitivity mode as a source follower amplifier comprising an amplifier transistor M2 and a readout transistor M3. The source follower transistors M2 and M3 are supported by a current source in the column buffer in order to read out the signal from the photodetector (pinned photodiode PD1). NMOS reset transistor M1 is used to reset the detector-generated current including photocurrent and dark current. The source follower configuration was earlier taught by Noble (IEEE Trans. Electron Devices, Vol. ED-15, No. 4, April, 1968) and the pinned diode by Saks (theory: Electron Device Letters, Vol. EDL-1, No. 7, July, 1980) and Teranishi (implementation: U.S. Pat. No. 4,484,210). The layout of the source follower is directed, however, toward optimally supporting the high sensitivity mode of the present invention. In addition to the 4T configuration of FIG. 3, a preferred pixel embodiment is shown in FIG. 4, wherein NMOS transistors M2 and M3 are replaced by a dual-gate transistor M2/3 to minimize an inverting amplifier's Miller capacitance to achieve the highest possible sensitivity and lowest noise in the high sensitivity mode of operation.

Figure 4:
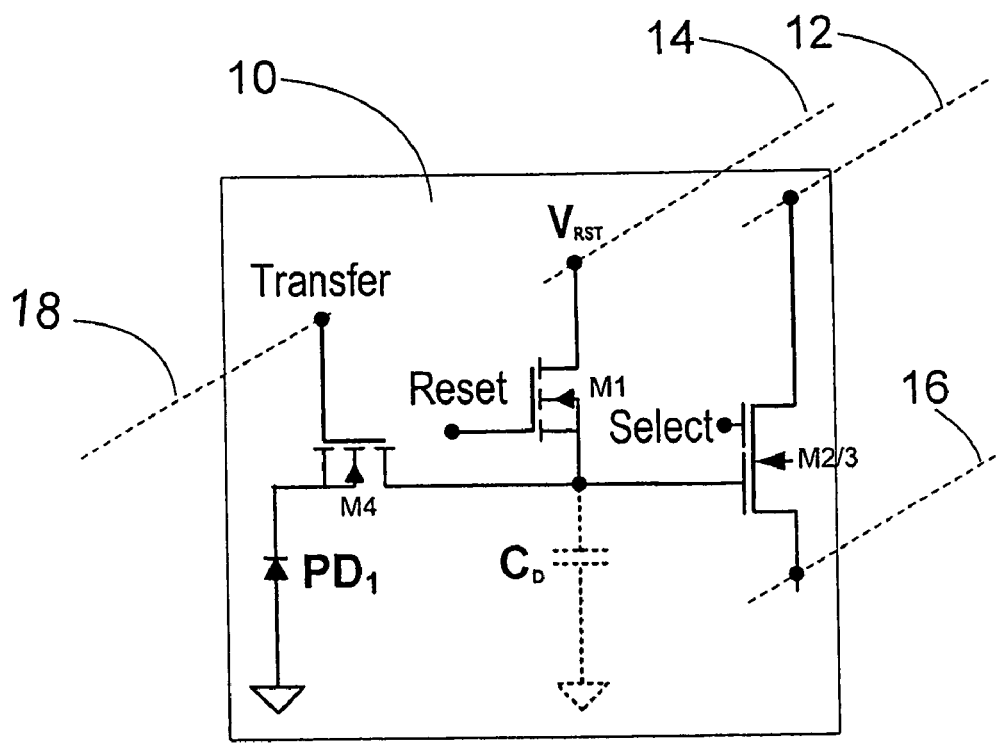
FIG. 4 is a schematic of a preferred embodiment of the 4T pixel circuit of the present invention that employs a dual-gate transistor in the source follower amplifier.
Figure 5A:
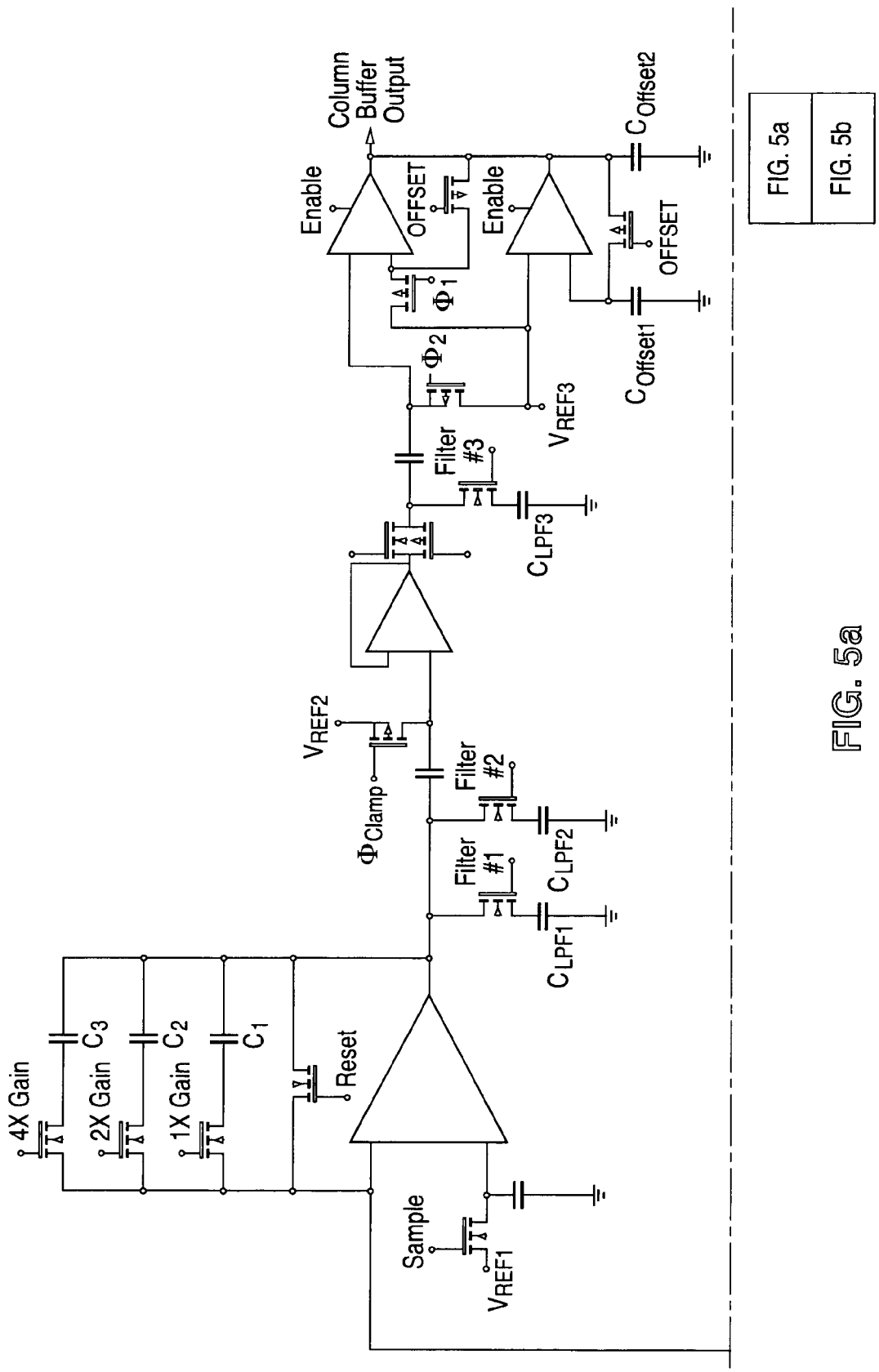
FIG. 5 is a schematic of the pixel readout circuit for standard sensitivity mode including the 4T pixel and the column buffer supporting each column of the iSoC image sensor.
Figure 5B:
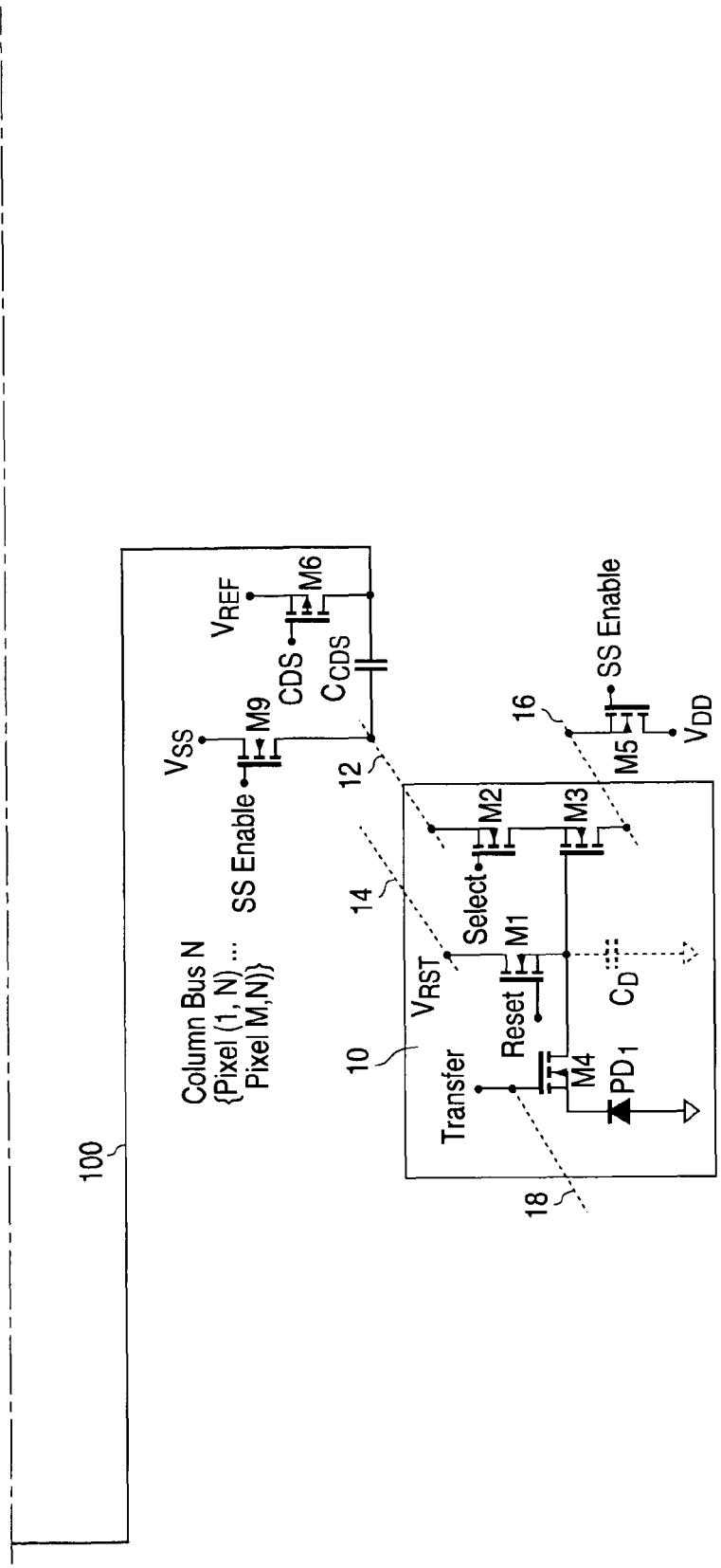

The standard sensitivity (SS) pixels of either FIG. 3 or FIG. 4 are read out using the basic column buffer design as earlier taught in U.S. Pat. No. 5,892,540. The resulting signal chain including additional column buffer components requiring for standard sensitivity (SS) readout is shown if FIG. 5. SS Enable NMOS transistor M9 is added to provide a current source for source follower readout of the pixel 10 via transistors NMOS M2 and M3. CDS transistor M6 and series capacitor CCDs are included in the signal chain to supply a low-noise signal to the remainder of the column buffer via signal bus 100. Enable switch transistor M5 is enabled to supply power to the source follower from supply $V_{DD}$. As taught in the prior art, CDS transistor M6 and series capacitor $C_{CDS}$ form a correlated double sampler that first stores the pixel reset value after the floating diffusion capacitance $C_{fd}$ has been reset prior to transferring the charge stored on photodiode PD1. Once the detector signal is transferred to the floating diffusion and read out through series capacitor $C_{CDS}$, kTC noise is virtually eliminated. The remainder of the signal processing in the column buffer is identical to that taught in U.S. Pat. No. 5,892,540.

Figure 6A:
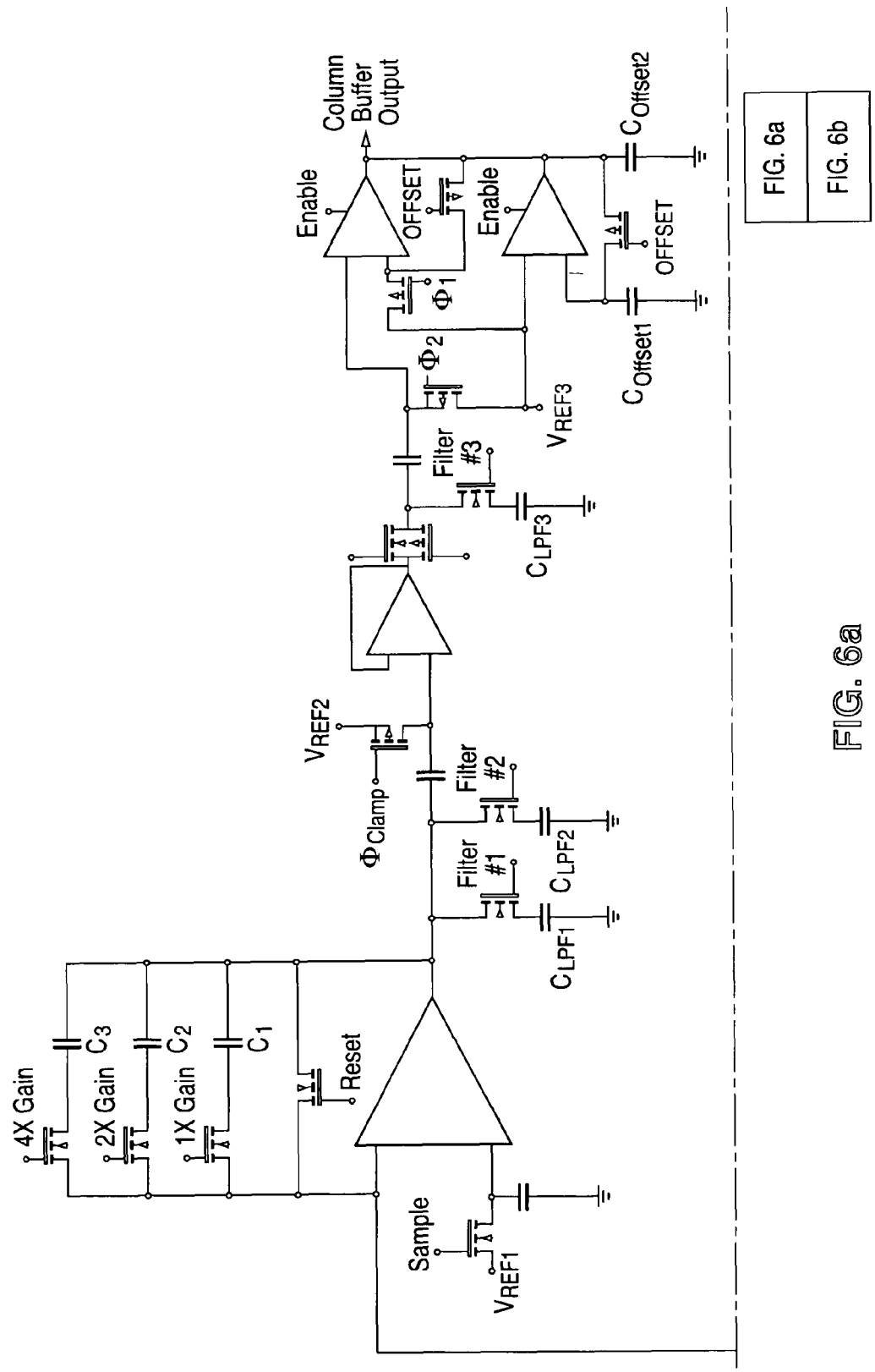
FIG. 6 is a schematic of the pixel readout circuit for high sensitivity mode including the 4T pixel and the column buffer supporting each column of the iSoC image sensor.
Figure 6B:
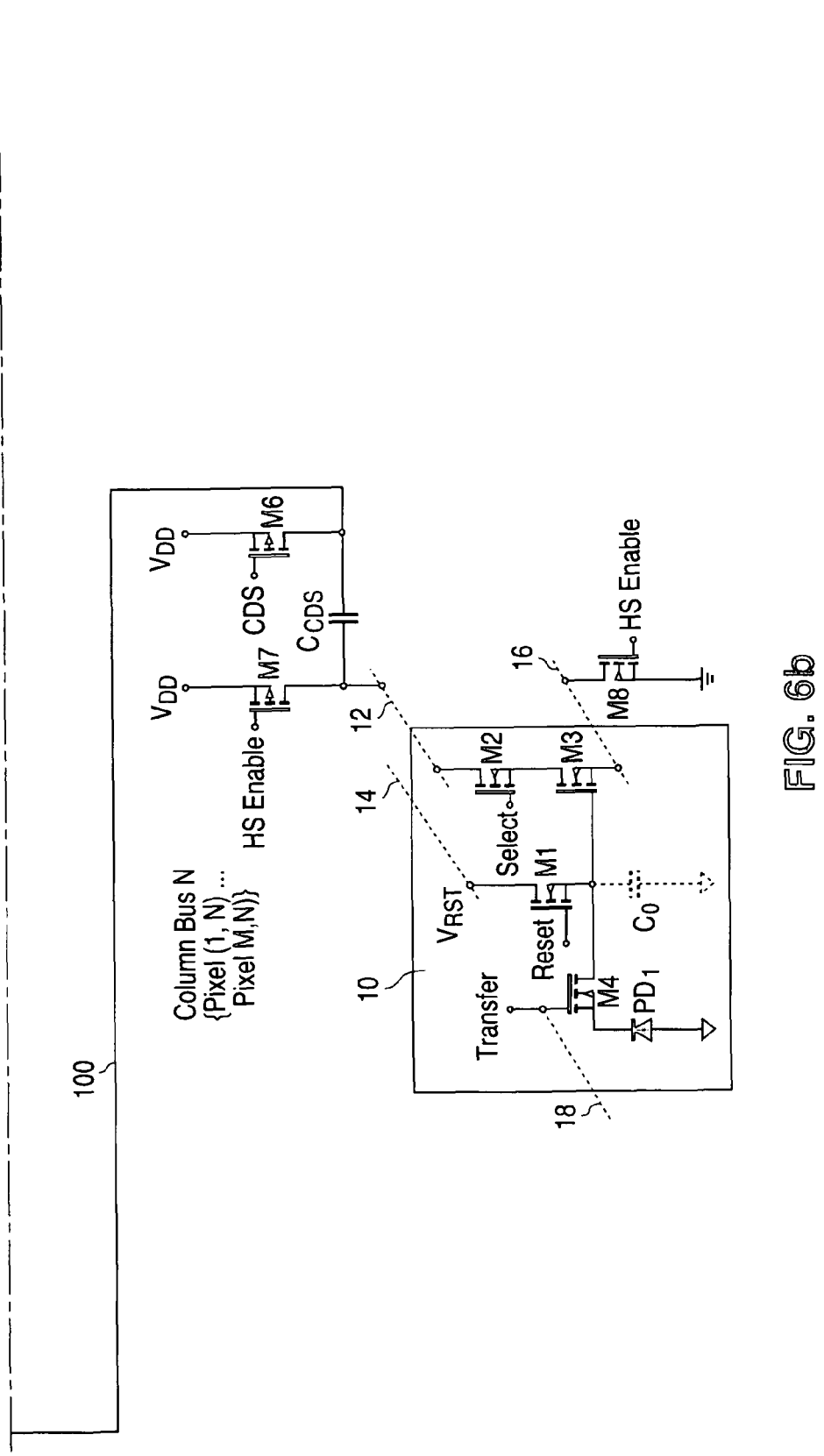

We now explain the improvements achieved via High Sensitivity (HS) readout. Again the pixel configuration is unchanged relative to either the simple embodiment of FIG. 3 or the preferred embodiment of FIG. 4. Rather than operating as a source follower, NMOS transistor M2 operates as the amplifier in a cascoded CMOS inverter and M3 is the cascode transistor. FIG. 6 shows the HS mode signal chain wherein additional components are supplied in the column buffer.

To begin HS readout of the pinned photodiode at each pixel in the mosaic image sensor, transistor M1 alternatively resets the floating diffusion to the prescribed reset voltage $V_{RST}$ rather than the supply voltage $V_{DD}$ as is often the case for SS mode readout. Reset voltage $V_{RST}$ is a programmable voltage supplied by the multi-voltage reference generator of the iSoC image sensor. The pixel reset level is next read into the column buffer circuit to begin the process of correlated double sampling for low-noise readout. Rather than enabling the front-end column buffer components used for source follower readout, PMOS current source transistor HS Enable M7 now completes a cascoded CMOS inverter including pixel transistors M2 and M3. Current source transistor HS Enable M7 is situated in the improved column buffer along with clamp capacitor $C_{Clamp}$ and clamp CDS transistor M6. Enable switch transistor M8 is enabled to supply power to the source follower from supply $V_{DD}$.

Figure 7:
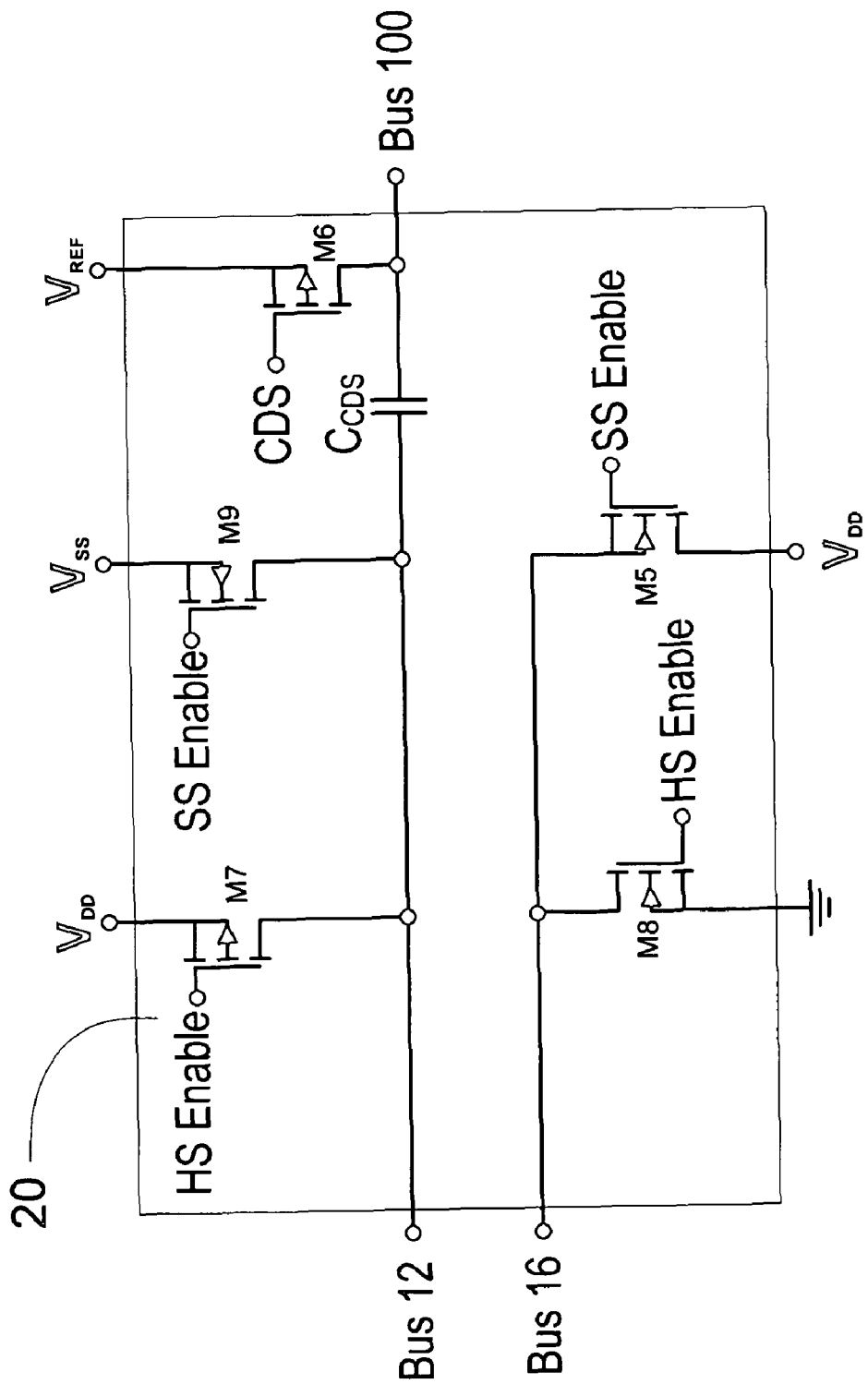
FIG. 7 is a schematic of a circuit block that is added to the circuit of FIG. 2 to support the operation of the present invention.

The improved column buffer hence includes all the additional components and related controls required for dual-mode operation in standard and high sensitivity readout modes. FIG. 7 therefore shows the circuit block that is added to the column buffer of U.S. Pat. No. 5,892,540 or, alternatively, the complete iSoC signal chain of U.S. Pat. No. 7,046,284 to support dual-sensitivity readout. As explained, transistors M5, M6, M7, M8 and M9 are used in addition to series capacitor $C_{CDS}$ to read each pixel in either SS or HS readout modes.

Regardless of the specific reset voltage used to begin HS mode readout, the reset level is read through the inverting amplifier comprising pixel transistors M2 and M3, and column buffer transistor M7, once transistor M8 is enabled by the HS ENABLE signal to ground the amplifier and complete the united feedback amplifier circuit. The amplified reset level is subsequently stored across $C_{CDS}$. The signal level is next read by enabling the Transfer gate of NMOS transistor M4 to transfer the integrated charge from the photodiode to the floating diffusion capacitance, $C_{fd}$.

NMOS transistors M2 and M3 form a Miller feedback integrator when united with PMOS transistor M5 and connected to ground by enabling M8. The feedback capacitance of the CMOS inverter is the amplifier's Miller capacitance, $C_M$. The Miller capacitance $C_M$ is minimized using a cascode configuration and optimally biasing M2 such that $C_M = C_{gsM3} + 2C_{gdM3}$, where $C_{gsM3}$ is the gate-to-source capacitance of M3 and $C_{gdM3}$ is the gate-to-drain capacitance of M3.

Feedback operation of the CMOS inverter maintains the floating diffusion at approximately the dc level established during reset. On the other hand, an amplified signal voltage relative to the CMOS inverter's output voltage during $C_{fd}$ reset subsequently forms at the inverter output; this signal, which builds when the detector is charged, is the transferred detector current multiplied by the feedback inverter's transimpedance. This transimpedance is proportional to the reciprocal of the minimum Miller capacitance. It will be apparent to those skilled in the art that $C_M$ is therefore nominally designed using common layout practices to be $1/3^{rd}$ to $1/4^{th}$ of the floating diffusion capacitance. HS mode hence produces 3 to 4× higher sensitivity than normal sensitivity mode. While HS mode requires $C_M$ to be roughly 1 femtofarad to several femtofarads, the design target can be verified by extracting the amplifier's parasitic capacitances, including that of M3, using commercial design tools and subsequently re-optimized after reducing a specific implementation to practice in the imaging product.

Based on the prior discussion, we can achieve even higher sensitivities by further reducing $C_M$ as long as the dynamic range remains acceptable. We hence disclose the pixel embodiment of FIG. 4 as the preferred CMOS embodiment for achieving the highest possible sensitivity since the gate-drain capacitance of M2/3 here is even smaller than achievable for the circuit of FIG. 3. In FIG. 3, the gate-to-drain capacitance of M3 is the overlap capacitance at the drain diffusion whereas M2/3 in FIG. 4 has smaller gate-to-drain capacitance; in this gate $C_{gdM2/3}$ is instead the parasitic fringing capacitance established by the interelectrode gap. This is very small in modern CMOS process technologies so that $C_M$ further reduces to the value set by $C_{gsM3}$ capacitance.

While those skilled in the art hence will appreciate the +6 dB, +12 dB, or even higher sensitivity is directly achieved by the invention, temporal noise is also reduced. The temporal noise of this type of Miller integrator can be estimated by using the simplified expression:

$$N_{temporal} = \frac{\sqrt{kTC_M \left( \frac{C_M + C_{fd}}{C_L + \frac{C_M C_{fd}}{C_M + C_{fd}}} \right)}}{q}$$

where $C_L$ is the load capacitance at the inverter's output. Assuming $C_L=1$ pF, $C_M=1$ fF, and $C=4$ fF, the estimated temporal noise is approximately 0.9 e–, i.e., below 1 e–. This compares favorably to the typical 4T pixel noise of 3 to 5 e–. The invention consequently enhances dynamic range and exposure latitude while simultaneously boosting sensitivity.

Those skilled in the art will appreciate that various adaptations and modifications of the just described preferred embodiments can be configured without departing from the scope and spirit of the invention. Therefore, it is to be understood that, within the scope of the appended claims, the invention may be practiced other than as specifically described herein.

What is claimed is:
1. An image sensor circuit comprising:
at least one pixel circuit comprising:
    a photodetector;
    a transfer transistor connected to the photodetector and a first supply bus;
    a reset transistor connected to the transfer transistor and a second supply bus;
    an amplifier transistor connected to the transfer transistor, the reset transistor, and a third supply bus;
    a signal readout transistor connected to the amplifier transistor and a signal bus; and
a dual sensitivity selection and support circuit comprising:
    a high sensitivity enable transistor connected to the signal bus;
    a standard sensitivity enable transistor connected to the signal bus;
    a correlated double sampling switch transistor connected to the signal bus;
    a correlated double sampling capacitor connected in series with the signal bus, between the standard sensitivity enable transistor and the correlated double sampling switch transistor;
    a high sensitivity switch transistor connected to the third supply bus; and
    a standard sensitivity switch transistor connected the to the third supply bus;
wherein a high sensitivity mode signal is read out from the photodetector during a high sensitivity mode, and a standard sensitivity mode signal is read out from the photodetector during a standard sensitivity mode, and wherein the high sensitivity enable transistor and the high sensitivity switch transistor are enabled to select a high sensitivity mode for low lighting conditions, and the standard sensitivity enable transistor and the standard sensitivity switch transistor are enabled to select a standard sensitivity mode for standard lighting conditions.

2. The image sensor circuit of claim 1, further comprising a column buffer circuit connected to the signal bus.

3. The image sensor circuit of claim 2, wherein the dual sensitivity selection and support circuit and the column buffer are shared by a column of pixels in an image sensor.

4. The image sensor circuit of claim 1, wherein the amplifier transistor and the readout transistor are formed as a single dual-gate transistor to reduce a Miller's capacitance associated with the circuit.

5. The image sensor circuit of claim 4, further comprising a column buffer circuit connected to the signal bus.

6. The image sensor circuit of claim 5, wherein the dual sensitivity selection and support circuit and the column buffer are shared by a column of pixels in an image sensor.

7. The image sensor of claim 4, wherein the high sensitivity enable transistor and the high sensitivity switch transistor are enabled to select a high sensitivity mode, and the standard sensitivity enable transistor and the standard sensitivity switch transistor are enabled to select a standard sensitivity mode.

8. The image sensor of claim 1, wherein the high sensitivity enable transistor and the high sensitivity switch transistor are enabled to select a high sensitivity mode, and the standard sensitivity enable transistor and the standard sensitivity switch transistor are enabled to select a standard sensitivity mode.

9. An image sensor array having a plurality of columns of pixels, the image sensor comprising:
   a column buffer connected to each column of pixels;
   a dual sensitivity selection and support circuit connected between the column bus and the pixels comprising:
      a high sensitivity enable transistor connected to a signal bus, the signal bus connected to each pixel in a column;
      a standard sensitivity enable transistor connected to the signal bus;
      a correlated double sampling switch transistor connected to the signal bus;
      a correlated double sampling capacitor connected in series with the signal bus, between the standard sensitivity enable transistor and the correlated double sampling switch transistor;
      a high sensitivity switch transistor connected to a supply bus, the supply bus connected to an amplifier transistor in each pixel; and
      a standard sensitivity switch transistor connected the to the supply bus;
   wherein a high sensitivity mode signal is read out from the photodetector during a high sensitivity mode, and a standard sensitivity mode signal is read out from the photodetector during a standard sensitivity mode, and wherein the high sensitivity enable transistor and the high sensitivity switch transistor are enabled to select a high sensitivity mode for low lighting conditions, and the standard sensitivity enable transistor and the standard sensitivity switch transistor are enabled to select a standard sensitivity mode for standard lighting conditions.

10. The image sensor of claim 9, wherein the high sensitivity enable transistor and the high sensitivity enable switch transistor are enabled to select a high sensitivity mode, and the standard sensitivity enable transistor and the standard sensitivity enable switch transistor are enabled to select a standard sensitivity mode.

11. An image sensor circuit having two sensitivity settings, the sensor comprising:
   at least one pixel circuit comprising:
      a photodetector;
      a transfer transistor connected to the photodetector and a first supply bus;
      a reset transistor connected to the transfer transistor and a second supply bus;
      an amplifier transistor connected to the transfer transistor, the reset transistor, and a third supply bus;
      a signal readout transistor connected to the amplifier transistor and a signal bus; and
   a dual sensitivity selection and support circuit comprising:
      a high sensitivity enable transistor connected to the signal bus to enable a high sensitivity signal readout;
      a standard sensitivity enable transistor connected to the signal bus to enable a standard sensitivity signal readout;
      a correlated double sampling switch transistor connected to the signal bus;
      a correlated double sampling capacitor connected in series with the signal bus, between the standard sensitivity enable transistor and the correlated double sampling switch transistor;
      a high sensitivity switch transistor connected to the third supply bus; and
      a standard sensitivity switch transistor connected the to the third supply bus;
   wherein a high sensitivity mode signal is read out from the photodetector during a high sensitivity mode, and a standard sensitivity mode signal is read out from the photodetector during a standard sensitivity mode, and wherein the high sensitivity enable transistor and the high sensitivity switch transistor are enabled to select a high sensitivity mode for low lighting conditions, and the standard sensitivity enable transistor and the standard sensitivity switch transistor are enabled to select a standard sensitivity mode for standard lighting conditions.

* * * * *